United States Patent

Ito

[11] Patent Number: 6,051,491
[45] Date of Patent: Apr. 18, 2000

[54] MULTILEVEL INTERCONNECTION STRUCTURE FOR INTEGRATED CIRCUITS AND METHOD OF PRODUCING SAME

[75] Inventor: Shinya Ito, Tokyo, Japan

[73] Assignee: NEC Corporation, Tokyo, Japan

[21] Appl. No.: 08/938,634

[22] Filed: Sep. 26, 1997

Related U.S. Application Data

[62] Division of application No. 08/734,417, Oct. 16, 1996, abandoned.

[30] Foreign Application Priority Data

Oct. 17, 1995 [JP] Japan ................................. 7-268627

[51] Int. Cl.$^7$ .................................................. H01L 21/4763
[52] U.S. Cl. ......................... 438/619; 438/623; 438/637; 257/773
[58] Field of Search .................................. 438/623, 622, 438/625, 628, 637, 669, 666, FOR 354, FOR 438, 611, 619; 257/773, 700, 736, 776, FOR 352; 148/DIG. 12

[56] References Cited

U.S. PATENT DOCUMENTS

| | | | |
|---|---|---|---|
| 5,407,860 | 4/1995 | Stoltz et al. | 437/180 |
| 5,476,817 | 12/1995 | Numata | 437/195 |
| 5,488,015 | 1/1996 | Havemann et al. | 437/195 |
| 5,510,293 | 4/1996 | Numata | 437/195 |
| 5,519,250 | 5/1996 | Numata | 257/632 |

FOREIGN PATENT DOCUMENTS

| | | |
|---|---|---|
| 0 603 104 A1 | 6/1994 | European Pat. Off. . |
| 5-36841 | 2/1993 | Japan . |

OTHER PUBLICATIONS

Jaeger, R.C., Introduction to Microelectronic Fabrication. vol. V. Addison Wesley Publishing Company, Inc. May, 1993. Pp. 147–148.

*Primary Examiner*—Olik Chaudhuri
*Assistant Examiner*—Ginette Peralta
*Attorney, Agent, or Firm*—Foley & Lardner

[57] ABSTRACT

In producing a multilevel interconnection structure, an insulator film is placed on and bonded to interconnecting lines laid on an insulating layer on a semiconductor substrate such that all the spacings between the interconnecting lines are left as vacant spaces. For example, the insulator film is a polyimide film or a silicon oxide film. The vacant spaces serve the purpose of reducing capacitance between adjacent interconnecting lines. After forming contact holes in the insulator film and filling the contact holes with a metal, upper-level interconnecting lines are laid on the insulator film.

23 Claims, 4 Drawing Sheets

MULTILEVEL INTERCONNECTION STRUCTURE FOR INTEGRATED CIRCUITS AND METHOD OF PRODUCING SAME

This application is a division of application Ser. No. 08/734,417, filed Oct. 16, 1996 now abandoned.

BACKGROUND OF THE INVENTION

This invention related to a multilevel interconnection structure useful particularly In semiconductor integrated circuits and a method of producing the multilevel interconnection structure.

In recent semiconductor integrated circuits, multilevel interconnections are widely used.

A conventional two-level interconnection structure is shown in FIG. 5. An insulating layer 52 is formed on a surface of a silicon substrate 50, and first-level interconnecting lines 54 are laid on the insulating layer 52. The interconnecting lines 54 are formed by first forming a total layer, usually an aluminum layer, on the insulating layer 52 and then patterning the metal layer by photolithography using a photoresist and subsequent etching. The interconnecting lines 54 are buried in a silicon oxide film 56 which is deposited on the insulating layer 52 after forming the interconnecting connecting lines 54. So, the spacings between the interconnecting lines 54 are filled with the deposited silicon oxide 56. The silicon oxide film 56 serves as an interlayer insulator. In the silicon oxide film 56 contact holes 58 are formed above some of the interconnecting lines 54 which are to be connected with interconnecting lines on the upper level, and the contact holes 58 are filled with a metal such an tungsten to provide interlayer connection plugs 60. After that, second-level interconnecting lines 62 are laid on the silicon oxide film 56 by patterning a metal layer.

With the progress of miniaturization of semiconductor devices and enhancement of the operation speed of the devices, multilevel interconnection structures are required to reduce capacitance between interconnections on upper and lower levels and also capacitance between adjacent interconnecting lines on each level. Capacitance between interconnections on upper and lower levels can be reduced by using a low permittivity insulator as the material of the interlayer insulating film and by increasing the thickness of the interlayer insulating film, and this is practicable. Capacitance between adjacent interconnecting lines on each level reduces if the spacings between the lines are widened, but this is contradictory to the desire of enlarging the scale of integration by narrowing the line space.

For the purpose of reducing the capacitance between adjacent interconnecting lines, JP-A 5-35841 proposes a multilevel interconnection structure in which a cavity is formed around and along an interconnecting line in order to utilize low permittivity of air. FIGS. 6(A) to 6(D) illustrates a process of producing the proposed structure.

Referring to FIG. 6(A), in insulating layer 72 is formed on a silicon substrate 70, and interconnecting lines 74A, 74B are laid on the insulating layer 72 by patterning a metal layer. The interconnecting line 74A is to be connected with interconnections on the upper level, and the line 74B does not need to be connected with interconnections on the upper level. A silicon nitride film 76 is deposited on the insulating layer 72 so as to completely bury the interconnecting lines 74A, 74B in the dielectric film 76, end a silicon oxide film 78 is deposited on the silicon nitride film 76. Above the interconnecting line 74A, a hole 80 is formed in the silicon oxide film 78. Referring to FIG. 6(B), a photoresist layer 82 is formed on the silicon oxide film 78, and in an elongate region above the interconnecting line 74B a number of small holes 84 are formed through the photoresist layer 82 and the oxide film 78 by photolithography and subsequent etching. Using the holes 84, the silicon nitride film 76 in a region above and alongside the interconnecting line 74B to removed by dry etching in order to form a cavity 86 around and along the interconnecting line 74B. Referring to FIG. 6(C), the photoresist layer 82 is removed, and a spin-on-glass is applied to the exposed surface of the silicon oxide film 78 and sintered to form a dielectric layer 88. At the position of the aforementioned hole 80 above the interconnecting line 74A, a contact hole 90 is formed through the insulating layers 88, 78 and 76, and the hole 90 is filled with a metal to provide an interlayer connection plug 92. An shown in FIG. 6(D), second-level interconnection lines 94 are formed on the dielectric layer 90 by patterning a metal layer.

In the structure shown in FIG. 6(D), the cavity 86 serves the purpose of reducing the capacitance between the interconnecting line 74B and the adjacent interconnecting line 74A. However, the cost of interconnection increases since complicated process steps are needed to form the cavity 86. Besides, when the spacing between the interconnection lines 74A and 74B is very narrow this method is impracticable because the cavity 86 for the line 74B and the contact hole 90 for the line 74A may connect with each other. Furthermore, capacitance between adjacent interconnecting lines in reduced only in limited regions of the interconnection structure since the cavity cannot be formed around interconnecting lines which are connected to interconnections on the upper or lower level.

SUMMARY OF THE INVENTION

It is an object of the present invention to provide a multilevel interconnection structure in which capacitance between adjacent interconnecting lines is greatly reduced by a simple means irrespective of the layout of interconnecting lines.

It is another object of the invention to provide a method of producing a multilevel interconnection structure according to the invention.

A multilevel interconnection structure according to the invention comprises a semiconductor substrate, an insulating layer formed on a surface of the substrate, a plurality of first interconnecting lines of a metal which are laid on the insulating layer, an interlayer insulator film which is placed on and bonded to the first interconnecting lines such that spacings between the first interconnecting lines are left an vacant spaces, a plurality of second interconnecting lines of a metal which are laid on the interlayer insulator film, and means for electrically connecting a portion of the first interconnecting lines to a portion of the second interconnecting lines through the interlayer insulator film.

The interlayer insulator film is a film of either an organic material such as, for example, a polyimide or polytetrafluoroethylene or an inorganic dielectric such as, for example, silicon oxide or silicon nitride.

For producing a multilevel interconnection structure, a method according to the invention comprises the steps of (a) laying a plurality of first interconnecting lines of a metal on an insulating layer formed an a semiconductor substrate, (b) placing an insulator film on the first interconnecting lines such that spacings between the interconnecting lines are left as vacant spaces, (c) forming a contact hole through the insulator film in a region above an interconnecting line and filling the contact hole with a metal, and (d) laying a plurality of second interconnecting lines of a metal on the insulator film.

Both the first and second interconnecting lines can be formed by patterning a metal layer by the conventional photolithography and etching operations.

In the above-stated structure according to the invention, capacitance between adjacent interconnecting lines on the lower level greatly reduces because vacant spaces exist alongside every interconnecting line. That is, low permittivity of air is efficiently utilized in this invention. The vacant spaces are provided by using the spacings between interconnecting lines and by simply placing an interlayer insulator film on the interconnecting lines on the lower level and bonding the insulator film to the interconnecting lines. Since interlayer insulation is indispensable to a multilevel interconnection structure, the invention entails no extra process steps to provide the vacant spaces between interconnecting lines.

The vacant spaces according to the invention can be provided irrespective of the widths of the spacings between interconnecting lines. Since there is no vacant space above the interconnecting lines under the insulator film, there is no possibility of connection of a vacant space with a contact hole in the insulator file even though the line spacings are very narrow. So, the vacant spaces can be provided to both interconnecting lines to be connected with the upper-level interconnections and interconnecting lines not connected with the upper-level interconnections. This is favorable for greatly reducing capacitance between adjacent interconnecting lines. In this invention, interlayer insulation is accomplished by bonding an insulator film to interconnecting lines on the lower level. Therefore, the height of the interconnecting lines on the lower level does not affect the cross-sectional shape of the interlayer insulator film, and hence the upper surface of the interlayer insulator film becomes flat.

Besides two-level structures, the invention is applicable to three-layer structures and still different multilayer structures.

BRIEF DESCRIPTION OF THE DRAWINGS

FIGS. 6(A) to 6(D) illustrate, in schematic cross-sectional views, a process or producing a known two-level interconnection structure.

DESCRIPTION OF THE PREFERRED EMBODIMENTS

As an example of the invention, FIGS. 1(A) to 1(D) illustrate a process of producing a two-level interconnection structure.

Figure 1:
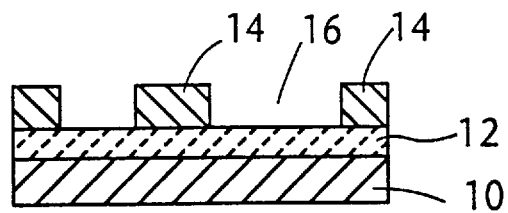
FIGS. 1(A) to 1(D) illustrate, in schematic cross-sectional views, a process of producing a two-level interconnection structure according to the invention.
Figure 1:
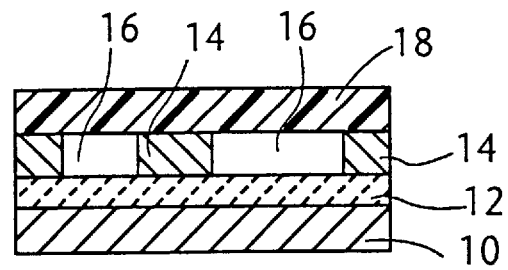
Figure 1:
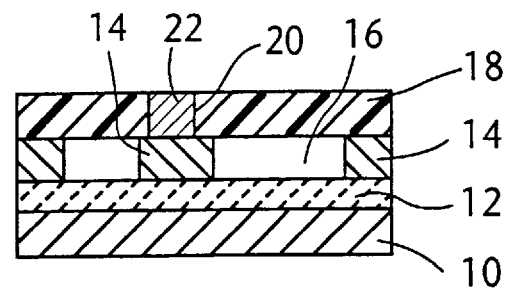
Figure 1:
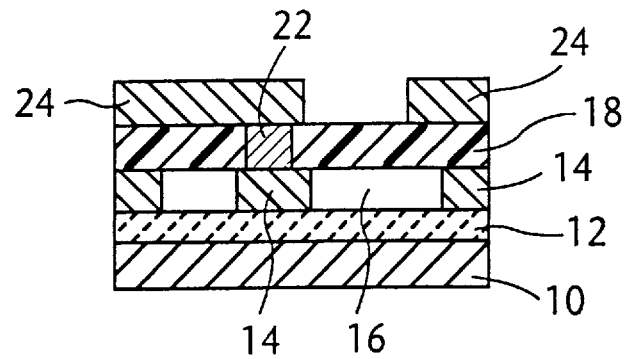

Referring to FIG. 1(A), an insulating layer 12 is formed on a surface of a silicon substrate 10. Then, interconnecting lines 14 are laid on the insulating layer 12 by first forming a metal layer such as an aluminum layer having a thickness of 0.4 $\mu$m and patterning the metal layer by photolithography and a subsequent etching operation. These process steps are well known. There are spacings 16 between the interconnecting lines 14.

Referring to FIG. 1(B). a polyimide film 18 is placed on and bonded to the interconnecting lines 14. For example, the thickness of the polyimide film 18 is 1 $\mu$m. The polyimide film 18 may be drawn out from a roll for placement on the substrate 10 on which the interconnecting lines 14 exist and out into a piece which conforms with the shape of the substrate 10. The bonding of the polyimide film 18 to the interconnecting lines 14 is accomplished by a heat treatment under pressure or by the application of a polyimide base adhesive which is cured by a subsequent heat treatment. The polyimide film 18 serves as an interlayer insulator. However, in this invention the polyimide film 18 does not intrude into the spacings 16 between the interconnecting lines 14. That is, under the polyimide film 18 the spacings 16 are left as vacant spaces.

Referring to FIG. 1(C). above each interconnecting line 14 which is to be connected with interconnections on the upper level, a contact hole 20 is formed in the polyimide film 18, and the hole 20 is filled with a suitable metal such as tungsten to provide an interlayer connection plug 22. Referring to FIG. 1(D), interconnecting lines 24 are laid on the polyimide film 18 by first forming a metal layer such as an aluminum layer having a thickness of 0.7 $\mu$m on the film 18 and then patterning the metal layer by photolithography and etching operations.

Figure 5:
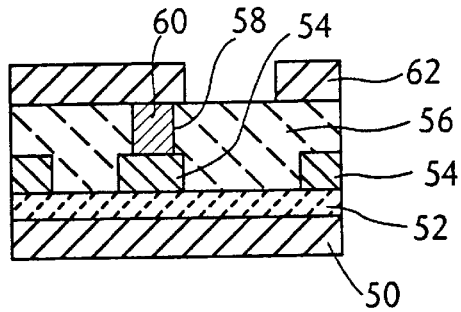
FIG. 5 is a schematic cross-sectional view of a conventional two-level interconnection structure.
Figure 5:
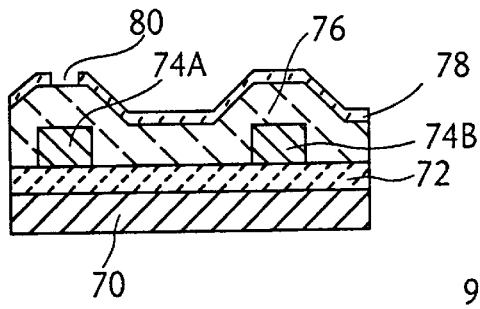
Figure 5:
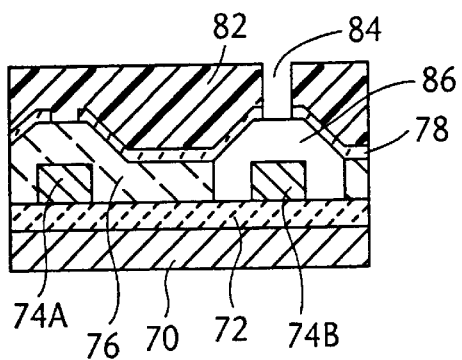
Figure 5:
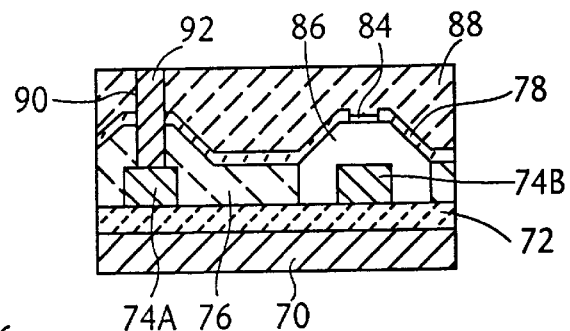
Figure 5:
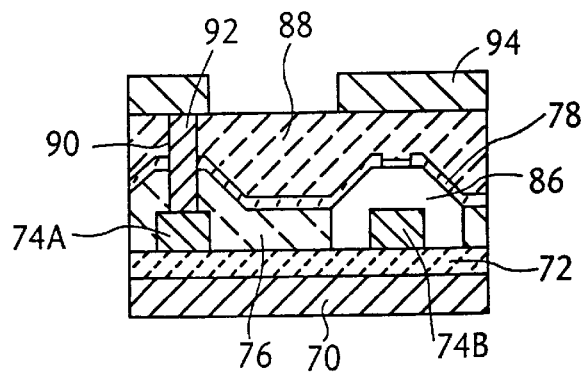

In the structure shown in FIG. 1(D), the vacant spaces 16 are provided to all the interconnecting lines 14 on the lower level. Therefore, a great reduction in capacitance between adjacent interconnecting lines is achieved. In fact, more than 30% reduction in the line-to-line capacitance is achieved by comparison with the conventional structure shown in FIG. 5 or the structure shown in FIG. 6(D).

The polyimide film 18 in FIG. 1(B) can be replaced by a film of a different insulator such as, for example, polytetrafluoroethylene, epoxy resin containing fine particle of glass fiber, silicon oxide or silicon nitride. It is preferable to use an insulator that is relatively low in relative permittivity.

Figure 2:
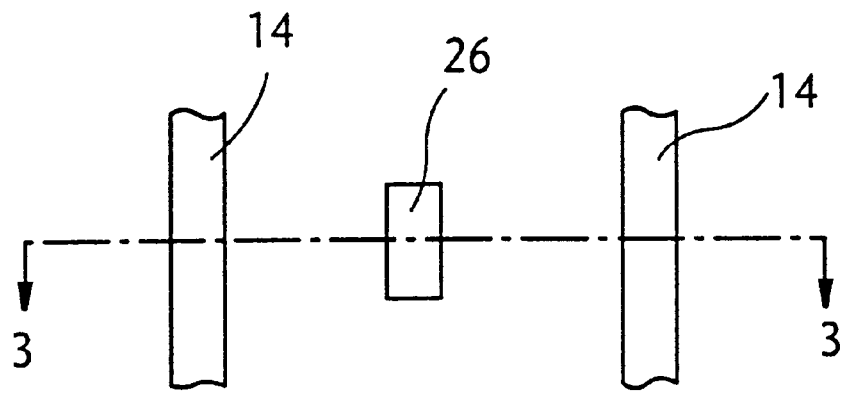
FIG. 2 shows, in a plan view, the placement of a supporting metal line between two adjacent interconnecting lines as an option in the invention.
Figure 3:
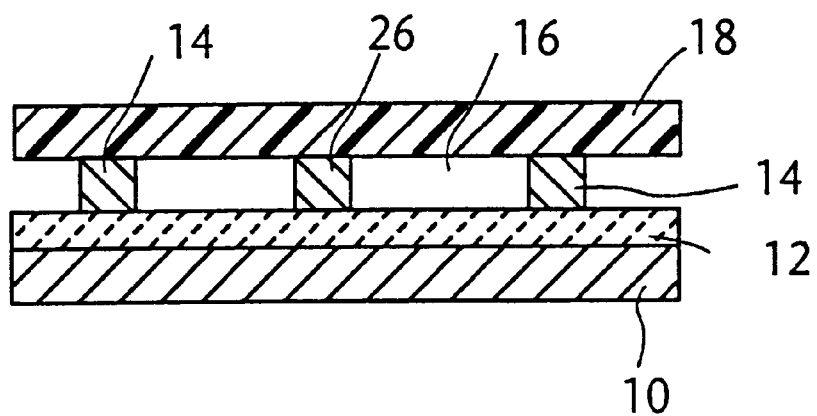
FIG. 3 shows, in a schematic sectional view taken along the line 3—3 in FIG. 2, the use of the supporting metal line in FIG. 2 to support an insulator film on the interconnecting lines.

In the structure according to the invention there is a possibility of sagging of the insulator film 18 in a region where the spacing between two adjacent interconnecting lines is relatively wide. A simple and effective solution to this problem is, as shown in FIGS. 2 and 3, to form a supporting metal line 26 (or a plurality of supporting metal lines) at a suitable location in a relatively wide spacing between two adjacent interconnecting lines 14. The height of the supporting metal line 26 should be equal to the height of the interconnecting lines 14, but the width and length of this metal line 26 are arbitrary. The supporting metal line 26 can be formed together with the interconnecting lines 14 by patterning a metal layer without need of any extra operation.

FIGS. 4(A) to 4(D) illustrate a process of producing an interconnection structure according to the invention by using silicon oxide as the material of the interlayer insulator film.

Figure 4:
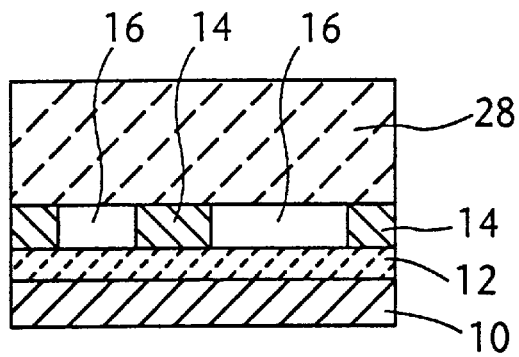
FIGS. 4(A) to 4(D) illustrate, in schematic cross-sectional views, a minor modification of the process illustrated in FIGS. 1(A) to 1(D)
Figure 4:
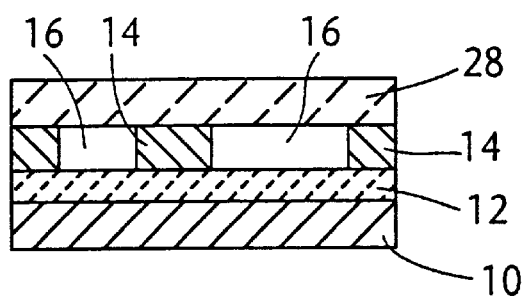
Figure 4:
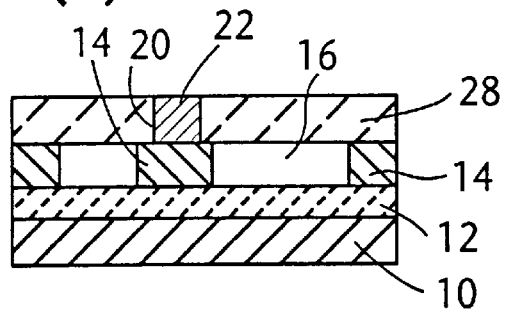
Figure 4:
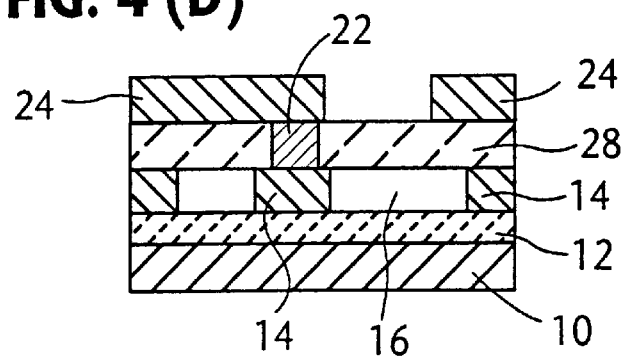

Referring to FIG. 4(A), first-level interconnecting lines 14 are laid on the insulating layer 12 on the substrate 10 by the conventional process described hereinbefore, and a relatively thick film 28 of silicon oxide is placed on and bonded to the interconnecting lines 14. For example, the silicon oxide film 28 has a thickness of about 40 $\mu$m. The silicon oxide film 28 is bonded to the interconnecting lines 14 by pressure bonding or by using an adhesive. Under the silicon oxide film 28, the spacings 16 between the interconnecting lines 14 are left as vacant spaces. Then, the thickness of the silicon oxide film 28 is reduced to a suitable extent, for example to the extent of 1 $\mu$m, by a chemical-mechanical polishing process using a conventional polishing slurry. After that, as shown in FIGS. 4(C) and 4(D), the interlayer connection plug 22 and interconnecting lines 24 on the upper level are formed by the operations described with reference to FIGS. 1(C) and 1(D).

By the process illustrated in FIGS. 4(A) to 4(D), the thickness of the interlayer insulator film 28 is widely variable and desirably regulatable.

The above-described examples relate to two-level interconnection structures, but the invention is applicable also to multilayer interconnection structures having three or more interconnecting metal layers. For example, in the case of a three-level structure, an insulator film corresponding to the film 18 in FIG. 1(D) or the film 28 in FIG. 4(D) is placed on and bonded to the second-level interconnecting lines 24.

What is claimed is:

1. A method of producing a multilevel interconnection structure useful in semiconductor integrated circuits, comprising the steps of:
   (a) laying a plurality of first interconnecting lines of a metal on an insulating layer formed on a semiconductor substrate;
   (b) placing an insulator film on said interconnecting lines;
   (c) bonding said insulator film to said interconnecting lines by pressure bonding or with an adhesive, such that said film does not intrude into the spacings between said interconnecting lines;
   (d) forming a contact hole through said insulator film in a region above one of said interconnecting lines and filling said contact hole with a metal; and
   (e) laying a plurality of second interconnecting lines of a metal on said insulator film.

2. A method according to claim 1, wherein said insulator film is a film of an organic material selected from the group consisting of polyimides and polytetrafluoroethylene.

3. A method according to claim 1, wherein said insulator film is a film of silicon oxide.

4. A method according to claim 3, further comprising the step of reducing the thickness of said insulator film bonded to said first interconnecting lines.

5. A method according to claim 1, wherein the step (a) comprises the sub-steps of (i) forming a first metal layer on said insulating layer and (ii) patterning the first metal layer to form said first interconnecting lines and the step (e) comprises the sub-steps of (i) forming a second metal layer on said insulator film and (ii) patterning the second metal layer.

6. A method according to claim 5, wherein at the sub-step (ii) of the step (a) said first metal layer is patterned so as to form at least one supporting metal line together with said first interconnecting lines, said supporting metal line being formed in the spacing between two of said first interconnecting lines to prevent sagging of said insulator film.

7. A method according to claim 1, wherein said film is bonded to said interconnecting lines by said pressure bonding.

8. A method according to claim 1, wherein said film is bonded to said interconnecting lines by said adhesive.

9. A method according to claim 8, wherein said adhesive is cured by heat treatment.

10. A method according to claim 1, wherein said film is bonded to said interconnecting lines by a heat treatment under pressure.

11. A method according to claim 1, wherein said insulator is an epoxy resin containing particles of glass fiber.

12. A method according to claim 1, wherein said insulating material is a silicon nitride film.

13. A method of producing a multilevel interconnection structure useful in semiconductor integrated circuits, comprising:
   (a) laying a plurality of first interconnecting lines of a metal on an insulating layer formed on a semiconductor substrate;
   (b) placing a separately prepared insulator film on said interconnecting lines;
   (c) bonding said insulator film to said interconnecting lines;
   (d) forming a contact hole through said insulator film in a region above one of said interconnecting lines and filling said contact hole with a metal; and
   (e) laying a plurality of second interconnecting lines of a metal on said insulator film.

14. A method according to claim 13, wherein said insulator film is a polyimide film.

15. A method according to claim 13, wherein said insulator film is a polytetrafluoroethylene film.

16. A method according to claim 13, wherein said insulator film is a film of an epoxy resin containing particles of glass fiber.

17. A method according to claim 13, wherein said insulator film is a film of an inorganic insulator selected from the group consisting of silicon oxide and silicon nitride.

18. A method according to claim 17, further comprising reducing the thickness of said insulator film bonded to said first interconnecting lines.

19. A method according to claim 13, wherein said film is bonded to said interconnecting lines by pressure bonding.

20. A method according to claim 13, wherein said film is bonded to said interconnecting lines with an adhesive.

21. A method according to claim 13, wherein said insulator film is bonded to said first interconnecting lines by a heat treatment under pressure.

22. A method according to claim 13, wherein the step (1) comprises the sub-steps of (i) forming a first metal layer on said insulating layer and (ii) patterning the first metal layer to form said first interconnecting lines and the step (d) comprises the sub-steps of (i) forming a second metal layer on said insulator film and (ii) patterning the second metal layer.

23. A method according to claim 13, wherein at the sub-step (ii) of the step (a) said first metal layer is patterned so as to form at least one supporting metal line together with said first interconnecting lines, said supporting metal line being formed in the spacing between two of said first interconnecting lines to prevent sagging of said insulator film.

* * * * *